United States Patent [19]

Buonanno

[11] Patent Number: 5,202,536
[45] Date of Patent: Apr. 13, 1993

[54] EMI SHIELDING SEAL WITH PARTIAL CONDUCTIVE SHEATH

[75] Inventor: Samuel S. Buonanno, Fairport, N.Y.

[73] Assignee: Schlegel Corporation, Rochester, N.Y.

[21] Appl. No.: 829,898

[22] Filed: Feb. 3, 1992

[51] Int. Cl.⁵ .............................................. H05K 9/00
[52] U.S. Cl. .............................. 174/35 GC; 174/35 R; 361/424
[58] Field of Search ............... 220/610, 614, 677, 681; 174/35 GC, 35 R, 35 MS; 361/424; 219/10.55 D, 10.55 R; 277/227, 228, 235 R

[56] References Cited

U.S. PATENT DOCUMENTS

| | | | |
|---|---|---|---|
| 3,089,915 | 5/1963 | Plummer | 174/36 |
| 3,140,342 | 7/1964 | Ehrreich et al. | 174/35 |
| 3,555,168 | 1/1972 | Frykberg | 174/35 |
| 3,624,267 | 11/1971 | Plummer | 174/36 |
| 4,247,737 | 1/1981 | Johnson et al. | 174/35 GC |
| 4,608,453 | 8/1986 | Freeman | 174/35 MS |
| 4,857,668 | 8/1989 | Buonanno | 174/35 GC |
| 4,988,550 | 1/1991 | Keyser et al. | 428/40 |
| 5,045,635 | 9/1991 | Kaldo et al. | 174/35 GC |
| 5,107,070 | 4/1992 | Benn, Sr. et al. | 174/35 GC |
| 5,107,071 | 4/1992 | Nakagawa | 174/35 GC |
| 5,120,903 | 6/1992 | Tam | 174/35 GC |

OTHER PUBLICATIONS

Nuccio et al., Conductive Seal for Electromagnetic Shielding, IBM Technical Disclosure Bulletin, vol. 20, No. 1, Jun. 1977, p. 281.

Primary Examiner—Leo P. Picard
Assistant Examiner—B. Lee Ledynh
Attorney, Agent, or Firm—Eckert, Seamans, Cherin & Mellott

[57] ABSTRACT

A seal for blocking propagation of electromagnetic energy through a gap between bodies having conductive surfaces at least adjacent the gap includes an elongated core element defining a resiliently compressible cross section which can be molded, extruded or otherwise formed. At least one elongated conductive sheath portion is attached to the core element at a surface of the core element exposed to the conductive surfaces of the bodies. The conductive sheath portion extends only part way around said cross section and defines ends which are spaced on the core element and are non-overlapping. Preferably, at least one additional sheath portion is attached to the core element and extends between the ends of the conductive sheath portions. The conductive sheath can include metal fibers or metallized resin fibers, woven or nonwoven. Preferably, the conductive sheath portion is a metallized fabric and the additional sheath portion is a nonconductive resin suitable for making an environmental seal. The cost of the seal is reduced as compared to a fully-conductively enclosed seal, with the added benefit of improved environmental sealing.

18 Claims, 2 Drawing Sheets

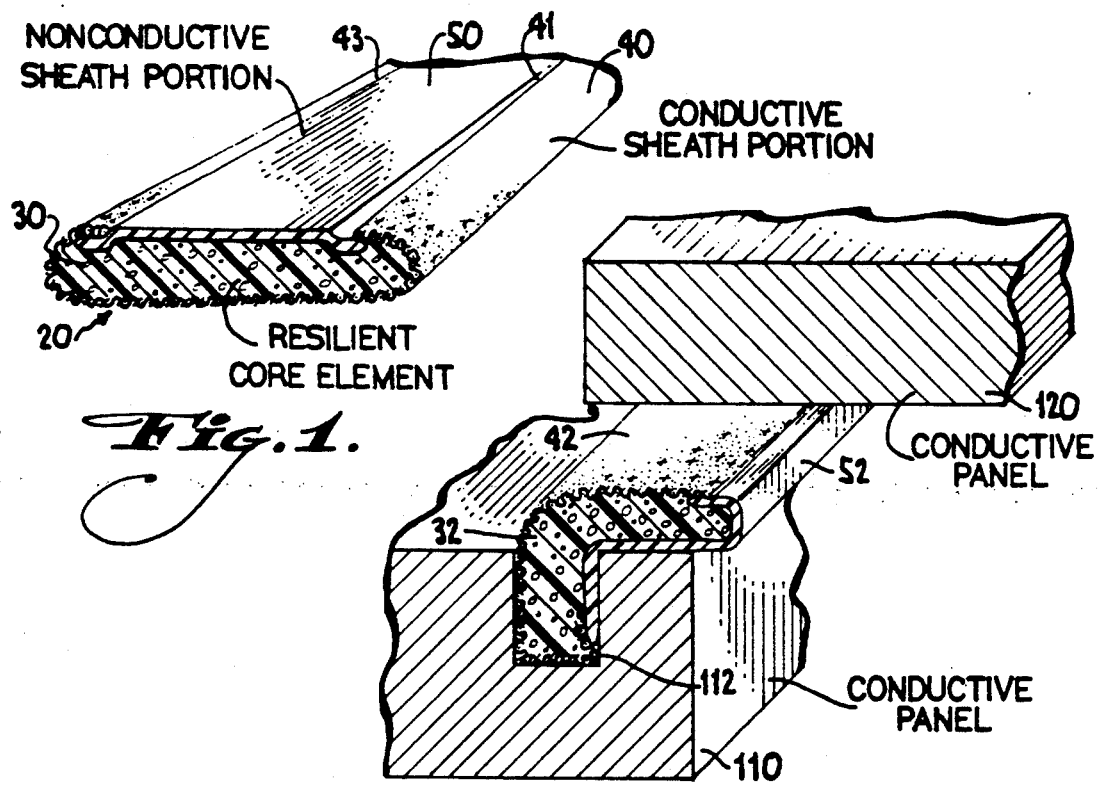
Fig. 1.
Fig. 2.
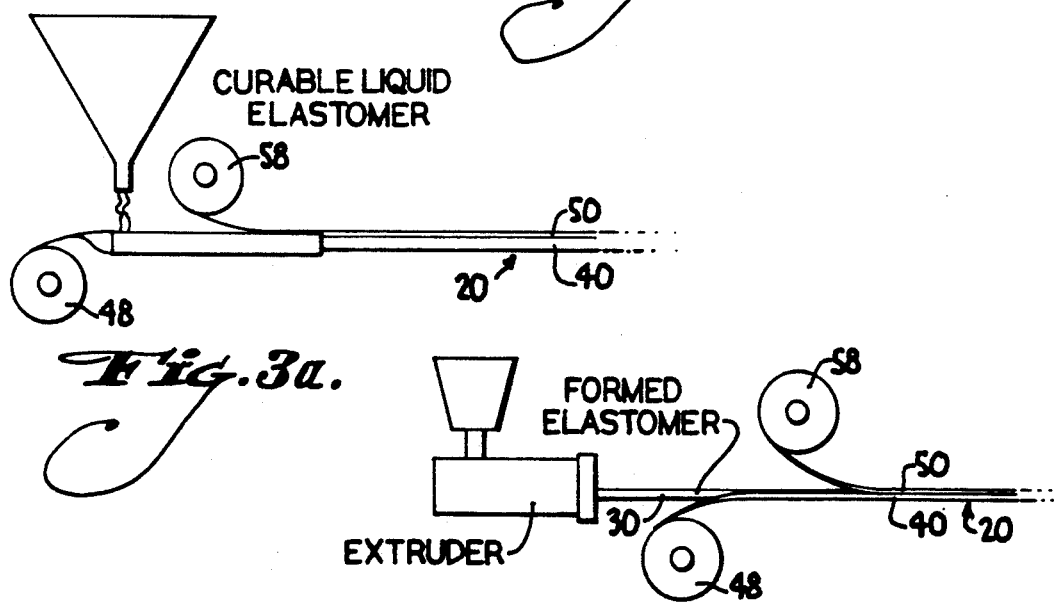
Fig. 3a.
Fig. 3b.

EMI SHIELDING SEAL WITH PARTIAL CONDUCTIVE SHEATH

BACKGROUND OF THE INVENTION

1. Field of the Invention

This invention relates to the field of seals and gasket structures for blocking gaps between conductive structures against passage of electromagnetic interference (EMI), while also sealing the gap environmentally against airflow, noise, dust or the like. The invention provides a seal of this type wherein a conductive surface extends only part way around a resilient core, and the remainder of the surface is nonconductive, the respective conductive and nonconductive surfaces being defined by sheath portions which together enclose the resilient core.

2. Prior Art

Various forms of shielding to damp or block electromagnetic interference are known to be useful for sealing against walls or other fixed structures, mountings, movable cabinet closures and other aspects of electrical equipment. Such seals may be used to confine fields that affect the operation of nearby equipment, or that carry sensitive information signals. The seals are also useful to prevent electromagnetic fields originating in nearby unshielded equipment from inducing currents in shielded circuits. Radio equipment, computing equipment and the like generally include a grounded conductive enclosure at least for circuitry which operates at high frequencies, to block propagation of the fields generated therein. An enclosure of this type may or may not wholly enclose the circuits which generate or are sensitive to electromagnetic interference. For example, a simple grounded conductive sheet disposed adjacent the conductors of a circuit board can reduce electromagnetic interference that otherwise would couple high frequency signals among the components on the circuit board.

In a full or partial shielding enclosure which has a plurality of structural elements, connections are needed to couple the conductive components of the shielding enclosure electrically to one another and to ground. Where the cabinet walls form panels which are bolted together, or otherwise do not define continuously conductive structures the panels must be coupled across any gaps. Therefore, one use of conductive seals is to bridge electrically across conductive structural elements such as cabinet panels and doors. The shield simply fills any gap between conductive panels, thus blocking the path through which interference could propagate. For high frequency signals a small gap is sufficient to enable leakage. The conductive seals are made resilient such that they expand as necessary to fill the gap and to accommodate any irregularities in the gap.

These seals are also useful in that they can environmentally close gaps between integrally continuous conductive panels of an enclosure. The seals thus exclude dust and noise, confine cooling air, etc. For maximum performance in environmental sealing the seal must closely engage the panels or other structures at a gap. This requirement is met in a seal that includes a resilient core for urging sealing surfaces against the panels, provided the sealing surfaces are apt for forming a close fitting seal over a sufficient area of contact. However, materials which are optimal for EMI shielding may be less than optimal for environmental shielding, and vice versa. In addition, the cost of an EMI shielding material is normally substantially higher than that of environmental sealing materials.

U.S. Pat. No. 4,857,668—Buonanno discloses a seal or gasket of a type having a continuously molded resilient foam core enclosed by a conductive sheath. The sheath can comprise a woven or non-woven resinous fabric such as nylon, plated with a elemental metal, a metal alloy or a combination of metallic platings over one another. The foam core expands in the molding process to produce a resilient body upon curing, the core material engaging the conductive fabric as the foam expands and cures. This seal provides a good electrical seal due to the conductivity of the sheath, and a good environmental seal against dust and the like, particularly because the sheath is flexible and the foam core urges the sheath to conform to irregularities of the sealed gap.

It is not always desirable to conductively bridge across all the conductive panels or sections of panels which may converge at a seal. Certain panels of subassemblies (e.g., inner conductive enclosures) may need to be electrically isolated from other panels (e.g., outer conductive enclosures). Similarly, the points at which electrical connections are made between subassemblies is a matter of concern in that the subassemblies should be referenced to a common ground. If connections are such as to provide a plurality of ground connections, relatively small potential differences between the respective ground connections result in large currents due to the low electrical resistance of the conductive paths along so-called ground loops. To improve shielding, electrical connections must be carefully planned. According to known techniques, combinations of conductive and nonconductive seals have required the use of separate seals for the conductive and nonconductive passages, respectively. A particular situation requiring attention to conductive and nonconductive aspects of sealing is the input/output plane at which signal and/or power connections traverse the wall of a conductive electronic enclosure, an application which can be termed an "I-O shield".

Various metals and combinations of metals can be used to form a conductive sheath in an EMI seal. The particular choice affects the effectiveness of the seal. If the surface finish is corrosion prone, the electrical surface contact resistance increases over time as the exposed metal surface becomes oxidized. It is possible to use a noble metal to decrease corrosion problems, e.g., gold, platinum, silver, nickel, etc. Similarly, a metal mesh or plated fabric having a relatively more corrosion prone metal can be plated thinly with a noble metal to render the surface less prone to corrosion. Another possibility is to employ a chemical coating, such as a chromate conversion coating on aluminum, to eliminate oxidation. The need to provide a corrosion resistant surface on the seal as necessary to keep the electrical contact resistance low in any event increases the expense of the seal.

In the seal according to Buonanno '668, the conductive sheath extends fully around the cross section of the core. This arrangement provides two layers of conductive material across the sealed gap (i.e., the layers on the two opposite sides of the seal). The seal performs well for EMI blockage and environmental sealing, but the cost is relatively high.

EMI seals frequently are used to seal movable parts such as cabinet doors. Over time the contact surfaces of seals having thin platings of noble metal or chemical treatments of the seal surface can wear through. One result is increased contact resistance due to oxidation of the exposed conductive material of the seal and/or the sealed surfaces. Another result is accelerated corrosion of the seal and/or the sealed surfaces generally, due to the galvanic action of the dissimilar metals employed, particularly in the presence of moisture. Corrosion makes the sealed surfaces more abrasive, and over time the electrical contact resistance of the seal increases. In U.S. Pat. No. 5,045,635—Kaplo et al, a combination EMI and environmental seal is provided. A sheathed foamed core as in Buonanno is coated further with a conductive coating comprising conductive particles suspended in a non-reactive and nonconductive resin, the particles being provided in sufficient concentration that conductive paths are provided through the resin due to contact between the conductive particles. The particles can be conductive carbon black and the binder a urethane paint. This further coating provides improved abrasion resistance, environmental sealing and stable electrical contact resistance. The coating is applied at least on that portion of the seal which engages an opposed cabinet wall, door or other sealed surface, i.e., the area in which the seal is subjected to abrasion against the sealed surface.

U.S. Pat. No. 3,140,342—Ehrreich et al discloses a strip seal arrangement having conductive and nonconductive portions which are formed such that the conductive portion extends along one side of an elongated seal and the nonconductive portion extends along an opposite side. The conductive and nonconductive portions are each defined by coextensive elongated bodies of resin material forming the seal, the difference being that only the conductive one has metal particles therein. In this form of seal, the metal particles make the conductive portion less compressible and the nonconductive portion provides the needed resilience. Ehrreich discloses the possibility that one or the other of the portions can be a foamed elastomer but does not attempt to sheath a foamed elastomer with a conductive sheath.

U.S. Pat. No. 3,555,168—Frykberg teaches a partially sheathed foam material in a planar or sheet form of seal which resides on the inner side of a cabinet door. The seal is a laminate of adhesive, foam, adhesive and metal foil. The foam is adhered to the cabinet door via the adhesive, and when the door is closed the foam urges the foil glued onto the opposite side of the foam into contact with cabinet walls against which the door is engaged.

U.S. Pat. Nos. 3,089,915 and 3,624,267, both to Plummer, are examples of shielding configurations which define sheets to be wrapped around cables and the like. The sheets have a conductive layer on one side, normally the side to be directed toward the cable, and a nonconductive layer on the other side, for environmental protection of the cable and shield. In order to completely encircle the cable, the ends of the sheet are overlapped when the sheet is wrapped around the cable. Moreover, the conductive layer is wrapped around the edge of the nonconductive layer in order to make an electrical connection between the edges in the area of the overlap.

The present invention concerns a compressible seal for residing in a gap. The conductive and nonconductive surfaces of the seal define an enclosure for the compressible core material. The nonconductive surfaces form a good environmental seal and the conductive layer functions as in Buonanno '668 to define an shielding partition bridging the gap for blocking propagation of electromagnetic energy. The seal is inexpensive and effective, and provides stable performance over time.

SUMMARY OF THE INVENTION

It is an object of the invention to provide a sheathed seal wherein an elongated resilient core is covered with a conductive sheet material around only a portion of its cross section.

It is also an object of the invention to reduce the expense of a conductive seal by providing conductive material around a portion of an elongated resilient body, and nonconductive material around a remaining portion.

It is a further object of the invention to combine a conductive sheath adapted for electrically bridging a gap, and a nonconductive sheath adapted for environmentally sealing across the gap.

It is also an object of the invention to provide a structure wherein an expanding foam core or an extruded core of resilient material can be confined in means defining an enclosure or sheath, while minimizing the amount of relatively more expensive conductive sheet material used.

It is yet another object to provide a versatile EMI and environmental seal structure which can be readily configured to provide a conductive bridge across predetermined gaps between particular conductive bodies, or to avoid forming a conductive bridge where electrical connection between certain such bodies is undesirable, while maintaining environmental sealing.

These and other objects are accomplished by a seal for blocking propagation of electromagnetic energy through a gap between bodies having conductive surfaces at least adjacent the gap, including an elongated core element defining a resiliently compressible cross section which can be molded, extruded or otherwise formed. At least one elongated conductive sheath portion is attached to the core element at a surface of the core element exposed to the conductive surfaces of the bodies. The conductive sheath portion extends only part way around said cross section and defines ends which are spaced on the core element and are non-overlapping. Preferably, at least one additional sheath portion is attached to the core element and extends between the ends of the conductive sheath portions. The conductive sheath can include metal fibers or metallized resin fibers, woven or non-woven. Preferably, the conductive sheath portion is a metallized fabric and the additional sheath portion is a nonconductive resin suitable for making an environmental seal. The cost of the seal is reduced as compared to a fully-conductively enclosed seal, with the added benefit of improved environmental sealing.

BRIEF DESCRIPTION OF THE DRAWINGS

There are shown in the drawings exemplary embodiments of the invention as presently preferred. It should be understood that the invention is not limited to the precise arrangements and instrumentalities shown and discussed, and is capable of variation in accordance with the scope of the appended claims and their reasonable equivalents. In the drawings, FIG. 1 is a perspective view, partly in section, illustrating a cross section through an elongated seal according to the invention;

FIG. 2 is a partial perspective view of an alternative elongated seal as disposed between two conductive bodies;

FIGS. 3a and 3b are diagrammatic views illustrating two methods for making the seal of the invention, namely using an expanding curing foam applied as a liquid to form the core (FIG. 3a), and extruding an elastomer whereby the core has a defined shape when sheathed (FIG. 3b);

DETAILED DESCRIPTION OF THE PREFERRED EMBODIMENTS

Figure 4:
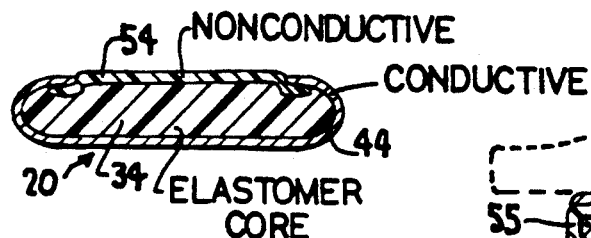
FIG. 4 is a section view illustrating an embodiment having a non-foamed elastomer core.

Referring to FIGS. 1 and 2, the elongated seal of the invention is arranged for blocking propagation of electromagnetic energy through a gap between bodies having conductive surfaces at least adjacent the gap. The conductive bodies may be, for example the walls and door of a cabinet for housing electrical equipment having high frequency signal paths such as computing equipment, radio equipment and the like. In order to block the propagation of energy through the gap, the seal has a conductive sheath portion which contacts the conductive surfaces of each of the bodies, and resiliently conforms to the confines of the gap. These confines may include irregularities which must be bridged, and the precise span of the gap may be variable, for example due to the pressure which may be exerted between the two bodies to be sealed. The seal is also applicable to conductive bodies which are to be fixed together relatively permanently, such as the walls defining a partition within an electrical enclosure, which are bolted in place over the seal.

Referring specifically to FIG. 1, the elongated seal 20 has an elongated core element defining a resiliently compressible cross section. At least one elongated conductive sheath portion 40 is disposed on the core element 30 at a surface of the core element which will engage against each of the conductive surfaces of the bodies. The conductive sheath portion extends only part way around the cross section of the core element 30 and therefore defines ends 41, 43 which are spaced from one another on the surface of the core element 30. In other words, the ends are non-overlapping so as to leave a space between them which is not bridged by the conductive sheath. However, the conductive sheath is arranged such that at least two areas intermediate the ends are positioned respectively to contact the conductive bodies to be sealed.

It is possible to employ a core element having a surface texture which is adequate for providing an environmental seal. Preferably, however, at least one additional sheath portion 50 is applied to the core element and extends between the ends 41, 43 of the conductive sheath portion 40. Accordingly, the conductive and nonconductive sheath portions define a complete closed cross section or elongated enclosure around the core element of the seal. In this manner the seal can be produced by a continuous molding or extrusion process wherein the material of the core element expands to fill the inner volume of the seal as defined by the space between the sheath portions It is also possible to provide a pre-molded seal element and to attach the conductive sheath portion, and preferably also the nonconductive sheath portion, by adhesive or the like. According to all of these alternatives, the surface area of the conductive sheath portion is smaller than that of a comparable seal wherein the sheath is conductive around the full cross section. Whereas the conductive element may require relatively expensive noble metal coatings, platings or other steps to protect the outer surface from oxidation, the invention reduces the cost of the seal while providing conductive material bridging across the gap for attenuation of electromagnetic energy.

The invention is applicable to any sealing situation wherein a single thickness of conductive material bridging the gap provides sufficient attenuation of the electromagnetic energy to be blocked. The amount of attenuation provided by the seal can be affected by the amount of metal included, the frequency of the electromagnetic energy and the dimensions of any gaps which may remain between metallic fibers and the like which make up the seal. Preferably the conductive sheath section according to the invention is a woven, knitted or non-woven fabric of metal fibers, for example in a resin binder. The "metal" fibers can be metal-plated resin fibers or the like as well. Examples of such sheathing materials are taught in U.S. Pat. No. 4,857,668—Buonanno. The conductive sheath section can also be conductively coated using a resin impregnated with conductive particles as in U.S. Pat. No. 5,045,635—Kaplo et al.

According to a preferred example of the invention, the conductive sheath portion is a woven or non-woven conductive fabric on the order of 1 to 10 mils thick, and preferably 3 to 8 mils thick. The nonconductive sheath portion can be 1 to 10 mils thick (preferably 3 to 6 mil) polyethylene and the core can be a resilient foam or elastomer in the range of 2 to 25, and preferably 3 to 10 lbs. per cubic foot. The dimensions and shape of the seal vary with the specific sealing application. Typically the seal is on the order of 1 to 6 cm., preferably 1 to 3 cm., on a side for adequate surface contact with conductive bodies such as aluminum or stainless steel cabinet walls and doors. If aluminum, the doors can be treated with a chromate conversion coating to prevent oxidation of the aluminum at the surface. In addition to the basic structure of a core and sheath, additional connecting elements such as metal or plastic clips, magnets or the like can be included for attaching the seal to one of the bodies defining the gap to be sealed. Alternatively or in addition, the seal can be provided with a contact adhesive for holding the seal in place.

The additional or nonconductive sheath portion 50 preferably is lapped with at least one of the spaced, non-overlapping ends 41, 43 of the conductive sheath portion 40. Preferably the two sheath portions are lapped at both ends 41, 43. The respective sheath portions and the core element can be attached together using adhesive, or if the core element is extruded or formed using an expanding foam which cures in situ, the two sheath elements can be arranged such that the material of the core element engages both of the sheath sections in the area of their junction. When using a continuously molded elastomer or foam for the core element, the core material can be arranged to bleed through between the overlapped edges defining a seam in the sheath, thereby effecting a seal or adhesive connection between the overlapped edges using the core material.

The nonconductive sheath portion 50 can simply provide a spacing section which confines the core element using a less expensive material than the conductive sheath material. The sheath portion 50 preferably is arranged for contact with at least one of the bodies so as to form an environmental seal bridging the gap. A preferred material for sheath section 50 is polyethylene. Alternatively, the nonconductive sheath section 50 can be a woven or non-woven fabric.

The seams or junctions between the conductive and nonconductive sheath portions in the embodiment shown extend along the longitudinal length of the seal 20. It is also possible to arrange discontinuous sections of conductive sheath with interspersed nonconductive sections along the length of the seal. Other configurations such as helically wound arrangements are also possible wherein the surface area of the conductive sheath material is sufficient to provide the necessary electromagnetic attenuation while the additional nonconductive sheath material reduces the expense of the seal.

The effectiveness of the seal for electromagnetic attenuation depends in part on the extent of contact with the bodies defining the gap to be sealed and in part on the continuity of the conductive material which resides in the gap. FIG. 2 illustrates an embodiment wherein the seal structure is to bridge across the gap between conductive bodies 110, 120, for example the walls and door of a cabinet for electromagnetic equipment. As in FIG. 1, the core element and the seal as a whole define sections which are flattened in cross section and the conductive sheath portion extends around an end of the at least one section which is flattened. In FIG. 2 the seal resides in a slot in conductive body 110. The conductive sheath portion 42 extends along the bottom and one side of the slot, and also extends along most of the surface which contacts the opposed conductive body 120. The conductive sheath portion is urged outwardly by the resilient core element 32, and therefore remains in good surface contact with the body 110. According to this arrangement the primary area of conductive contact with body 110 is in the environmentally protected area of the slot, and not along the facing (or top) surface of body 110, where opening and closing of the gap will cause the seal to movably bear against the surface of body 110.

Along the top of conductive body 110, the seal of FIG. 2 is faced with the nonconductive sheath portion 52. Portion 52 extends around the edge of the core element 32 to define the innermost edge of the seal o the side contacting the opposed conductive body 120. With this arrangement, dust and the like which impinges on the side of the seal where the nonconductive sheath portion wraps around the edge will be prevented from reaching the area of conductive contact between conductive sheath portion 42 and the opposed conductive body 120. The nonconductive seal portion can be a continuous plastic film or can be coated or otherwise made into a relatively smooth and close fitting environmental seal portion for limiting the extent to which environmental influences can pass the seal. Therefore, according to the embodiment of FIG. 2 the conductive bridging of the seal is relatively extensive along the slot and upper face areas of the seal, while at the same time the additional nonconductive sheath portion protects the seal and improves its effectiveness over time.

FIGS. 3a and 3b are schematic illustrations of ways in which the seal according to FIGS. 1 and 2 can be manufactured. In FIG. 3a, the core material is a flowable liquid when applied to the sheath, and thereafter cures in the sheath to assume a defined shape. In FIG. 3b, the core material is at least partially shaped before the sheath is applied, the shape being defined, for example, by the contour of an extrusion die and the core material being such as to at least partially cure into a defined shape as it is extruded.

The core material according to the method shown in FIG. 3a can be, for example, a urethane foam which is mixed and applied in liquid form into at least a partial receptacle formed by one or both of the conductive sheath portion and the nonconductive sheath portion. The foam expands to fill the opening defined therein. The core can be a foam as in FIGS. 1 and 2, or a different form of resilient material, such as a non-foam elastomer as shown in FIG. 4.

Comparable reference numbers are used in the drawings to identify corresponding elements. Referring to FIG. 3a, an elastomer, curing agent and foaming agent are mixed in liquid form for application to the sheath portions. The two sheath portions are supported to define a receptacle which shapes the core as the elastomer cures. For example, opposed contoured rollers which together define a travelling trough-like form can be applied over the sheath portions confining the core element, to shape the seal as the core element cures and assumes a defined shape. Alternatively, a form defining the seal shape can be carried along with the seal to hold the seal in the required shape as the core material cures over a longer time, for example during heat treatment for curing thermoset components of the core material. The conductive and nonconductive sheaths are fed in elongated strips from rolls 48, 58, respectively.

Referring to FIG. 3b, an extruded or otherwise substantially formed core can be provided and fed to a station at which the sheath portions are adhered. The sheath portions can be adhered by providing a shaped core with a tacky adhesive surface, or an additional adhesive can be applied to the surfaces of the sheath for adhering the sheath portions to the core and to one another.

Figure 5:
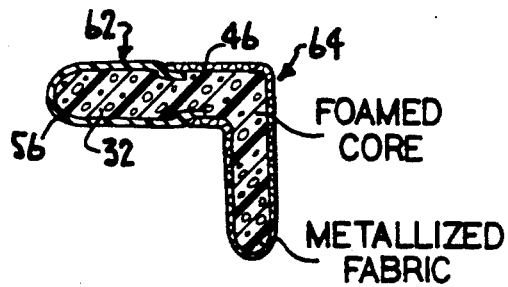
FIG. 5 is a section view of an alternative configuration for the seal sheaths.

The faces of the seal which are to rest against the sealed panels can be flattened in cross section. The conductive and nonconductive sheath portions respectively form laterally adjacent electromagnetic and environmental seals which are urged by the core element into contact with at least one of the surfaces of the bodies. As shown in FIG. 5, the contact surface 64 of the conductive sheath portion 45 can encompass one entire side of the seal, being wrapped around at the bottom to form an entirely conductive area disposed against one of the conductive bodies 120, and laterally adjacent conductive and nonconductive areas disposed against the other of the conductive bodies 110. According to this embodiment the environmental seal formed by nonconductive sheath portion 55 is disposed only on one side of the seal 62.

Figure 6:
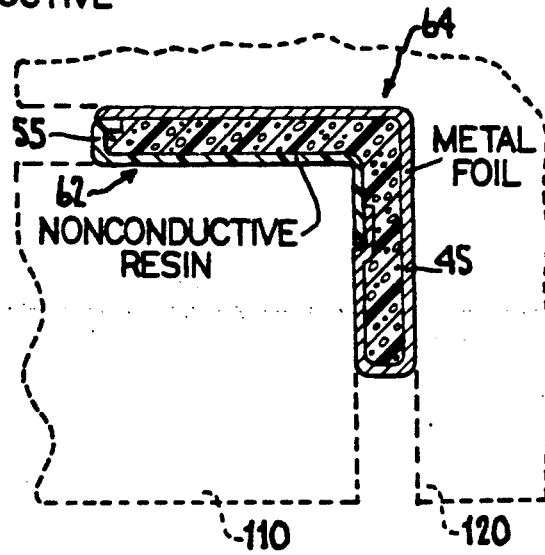
FIG. 6 is a section view of another alternative configuration.

Alternatively, and as shown in FIG. 6, the conductive sheath portion 46 and nonconductive sheath portion 56 can each occupy areas on both opposite sides of seal 64, whereby a full environmental seal as well as conductive contact are maintained against both bodies 110, 120 and across the gap between them.

Figure 7:
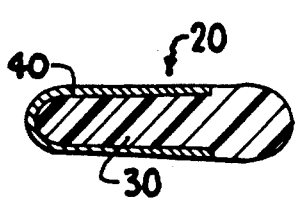
FIG. 7 is a section view of an alternative embodiment wherein the core element defines the nonconductive surface portion of the seal; and, FIG. 8 is a section view of an alternative embodiment including a plurality of conductive and nonconductive portions.

According to the foregoing embodiments, the core element of the seal is wholly surrounded by the sheath and the sheath comprises conductive and nonconductive sections. It is also possible to arrange a seal wherein the core is exposed in at least one area, with conductive and nonconductive sheath portions provided around only part of the periphery of the seal. In FIG. 7, a conductive sheath portion 46 extends part of the way around the periphery of the core element. The nonconductive surface of the seal is defined by the surface of the core element, which is exposed between the edges of the conductive sheath portion. Of course this embodiment requires that the core element be made of a nonconductive material.

Figure 8:
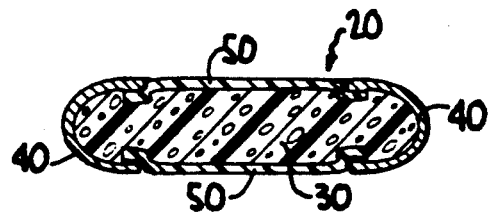

The embodiment shown in FIG. 8 includes four sheath portions. Two nonconductive sheath portions 56 occupy opposite faces of the seal, and two interposed conductive sheath portions 46 occupy opposite faces between the nonconductive portions. This embodiment is appropriate for providing a plurality of electrically isolated conductive seals, for example for sealing environmentally a gap between conductive structures which individually require conductive sealing. The invention concerns both the seal itself and the seal structure for blocking propagation of electromagnetic energy, i.e., the seal structure including the at least two bodies having conductive surfaces disposed adjacent a gap to be sealed. The elongated core element defining a resiliently compressible cross section urges at least one elongated conductive sheath portion attached to the core element at a surface of the core element exposed to the conductive surfaces of the bodies, the conductive sheath portion extending part way around said cross section and defining ends which are spaced on the core element and non-overlapping. The conductive sheath portion in each case includes areas intermediate the ends engaging on respective said conductive surfaces for both conductive surfaces of the at least two bodies. Although the surface of the core element can define a nonconductive surface which occupies the space between the ends of the conductive sheath portion, or preferably, at least one additional sheath portion attached to the core element extends between said ends of the conductive sheath portions, the conductive sheath portion and the additional sheath portion together extending fully around the cross section of the core element.

A number of variations are also possible. The conductive sheath portion can be selectively conductive in respective surface areas along the longitudinal extension of the core element, as necessary to provide sufficient contact between the bodies to be sealed, while providing a more extensive environmental seal. The selectively conductive areas can be coupled electrically by a conductor which extends from surface area to surface area along the seal. The particular character of the resilient core, the conductive sheath portion and the nonconductive sheath portion are subject to variations as discussed. For example, the core element can be one of a molded core, an extruded core and a core which is formed in situ in at least one of said conductive sheath portion and said additional sheath portion, etc. The nonconductive sheath can be any sheet material which provides good surface contact with the sealed bodies for providing an environmental seal, and preferably is a low cost sheet material. The conductive sheath can include metal fibers, metallized non-metal fibers, or other conductive materials in any structural configuration which provides electrical coupling between the sealed bodies and defines interconductor gaps which are sufficiently small to substantially attenuate propagating electromagnetic energy at the frequency of interest.

The invention having been disclosed in connection with certain preferred embodiments, additional variations will become apparent to persons skilled in the art. Whereas the invention is intended to encompass not only the particular embodiments disclosed but also a reasonable range of equivalents, reference should be made to the appended claims rather than the foregoing examples, in order to assess the scope of the invention in which exclusive rights are claimed.

I claim:

1. A seal for blocking propagation of electromagnetic energy through a gap between bodies having conductive surfaces at least adjacent the gap, comprising:

an elongated core element defining a resiliently compressible cross section;

at least one flexible elongated conductive sheath portion attached to the core element at a surface of the core element exposed to the conductive surfaces of the bodies, the conductive sheath portion extending only part way around said cross section and defining ends which are spaced on the core element and non-overlapping; and, at least one additional sheath portion attached to the core element, the additional sheath portion being flexible and elongated, and extending between said ends of the conductive sheath portions, the conductive sheath portion and the at least one additional sheath portion together extending fully around the cross section of the core element, the conductive sheath portion defining a conductive exterior surface of the seal extending around a first part of the cross section of the seal and the at least one additional sheath portion defining a nonconductive exterior surface of the seal extending around a second part of the cross section of the seal, the additional sheath portion being lapped with at least one of the spaced, non-overlapping ends of the conductive sheath portion, whereby the conductive sheath portion and the additional sheath portion respectively define electromagnetic and environmental barriers bridging across the gap.

2. The seal according to claim 1, wherein the nonconductive exterior surface defined by the additional sheath portion is arranged relative to the conductive exterior surface such that the additional sheath portion contacts at least one of the bodies so as to form an environmental seal bridging the gap.

3. The seal according to claim 1, wherein the conductive sheath portion and the additional sheath portion together extend fully around the cross section of the core element, and the core element comprises a continuously molded resilient elastomer.

4. The seal according to claim 3, wherein at least one of the conductive sheath portion and the additional sheath portion is adhered to a surface of the core element by direct adherence to the continuously molded resilient elastomer.

5. The seal according to claim 4, wherein the conductive sheath portion comprises a metallized flexible fabric.

6. The seal according to claim 5, wherein the core element is a resilient polyurethane foam.

7. The seal according to claim 6, wherein the conductive sheath portion comprises material chosen from the group consisting essentially of woven metal filaments, woven metal filaments and knitted metal filaments.

8. The seal according to claim 6, wherein the conductive sheath portion comprises at least one of metal filaments and metallized filaments.

9. The seal according to claim 8, wherein the conductive sheath portion comprises resin filaments having a conductive coating.

10. The seal according to claim 6, wherein the conductive sheath portion comprises a conductive coating having at least one of a metal plating and a conductive resin coating.

11. The seal according to claim 1, wherein the core element has a defined shape and the conductive sheath portion and the additional sheath portion comprise flexible material adhered to the core element in said defined shape.

12. The seal according to claim 1, wherein the conductive sheath portion comprises a flexible metallized material adhered to the core element by an adhesive.

13. The seal according to claim 1, wherein the additional sheath portion is a nonconductive sheath portion and is lapped with at least one of the spaced, non-overlapping ends of the conductive sheath portion along a line of elongation of the seal.

14. The seal according to claim 1, wherein the core element defines at least one section which is flattened in cross section and wherein the conductive sheath portion extends around an end of the at least one section which is flattened.

15. The seal according to claim 14, wherein the conductive sheath portion and the at least one additional sheath portion each extend across a face of the section which is flattened in cross section, whereby the conductive and nonconductive sheath portions form laterally adjacent electromagnetic and environmental seals which are urged by the core element into contact with at least one of the surfaces of the bodies.

16. A seal structure for blocking propagation of electromagnetic energy, comprising:
  at least two bodies having conductive surfaces disposed adjacent a gap to be sealed;
  an elongated core element defining a resiliently compressible cross section;
  at least on elongated flexible conductive sheath portion attached to the core element at a surface of the core element such that the conductive sheath portion is exposed to the conductive surfaces of the bodies, the conductive sheath portion extending part way around said cross section and defining ends which are spaced on the core element and non-overlapping, the conductive sheath portion including areas intermediate the ends engaging on respective said conductive surfaces for both conductive surfaces of the at least two bodies; and,
  at least one additional nonconductive sheath portion attached to the core element, the additional sheath portion being flexible and elongated, and extending between said ends of the conductive sheath portions, the conductive sheath portion and the additional sheath portion together extending fully around the cross section of the core element, whereby the conductive sheath portion and the additional sheath portion respectively define electromagnetic and environmental barriers bridging across the gap.

17. The seal structure according to claim 16, wherein the conductive sheath portion is selectively conductive in respective areas along a longitudinal extension of the core element.

18. The seal structure according to claim 17, wherein the core element is one of a molded core, an extruded core and a core which is formed in situ in at least one of said conductive sheath portion and said additional sheath portion.

* * * * *

UNITED STATES PATENT AND TRADEMARK OFFICE
CERTIFICATE OF CORRECTION

PATENT NO. : 5,202,536
DATED : April 13, 1993
INVENTOR(S) : Samuel S. Buonanno

It is certified that error appears in the above-identified patent and that said Letters Patent is hereby corrected as shown below:

On title page, item [56], U.S. PATENT DOCUMENTS,

References Cited, U.S. Patent No. 3,555,168, the issue date should be changed from "1/1972" to --1/1971--.

Column 7, line 59, change "o" to read --on--.

In the Claims

Col. 11, line 10, "woven" should read --nonwoven--

Column 11, line 27, change "claim 1" to read --claim 11--.

Signed and Sealed this

Eighteenth Day of January, 1994

*Attest:*

BRUCE LEHMAN

*Attesting Officer*　　　*Commissioner of Patents and Trademarks*